United States Patent
Suzuki et al.

(10) Patent No.: US 7,559,992 B2
(45) Date of Patent: Jul. 14, 2009

(54) SEMICONDUCTOR PROCESSING APPARATUS AND METHOD

(75) Inventors: Daisuke Suzuki, Kai (JP); Masayuki Hasegawa, Kofu (JP); Atsushi Endo, Kai (JP)

(73) Assignee: Tokyo Electron Limited, Tokyo (JP)

( * ) Notice: Subject to any disclaimer, the term of this patent is extended or adjusted under 35 U.S.C. 154(b) by 486 days.

(21) Appl. No.: 11/305,201

(22) Filed: Dec. 19, 2005

(65) Prior Publication Data

US 2006/0134811 A1    Jun. 22, 2006

(30) Foreign Application Priority Data

Dec. 22, 2004   (JP)   .............. 2004-371680

(51) Int. Cl.
C23C 16/00    (2006.01)
C25F 1/00     (2006.01)
C25F 3/30     (2006.01)
C25F 5/00     (2006.01)

(52) U.S. Cl. .................. 118/719; 118/715; 134/1.1

(58) Field of Classification Search ................ 118/715, 118/719, 726; 134/1.1; 204/298.07
See application file for complete search history.

(56) References Cited

U.S. PATENT DOCUMENTS

2005/0145333 A1 * 7/2005 Kannan et al. ......... 156/345.24

FOREIGN PATENT DOCUMENTS

| CN | 1325130 A   | 12/2001 |
| CN | 1491429 A   | 4/2004  |
| JP | 6-13325     | 1/1994  |
| JP | 2003-218098 | 7/2003  |
| KR | 0137968     | 2/1999  |
| KR | 2002-0091346| 12/2002 |

* cited by examiner

*Primary Examiner*—Walter L Lindsay, Jr.
(74) *Attorney, Agent, or Firm*—Oblon, Spivak, McClelland, Maier & Neustadt, P.C.

(57) ABSTRACT

A semiconductor processing apparatus includes a process chamber to accommodate a target substrate, a gas supply system to supply a process gas into the process chamber, an exhaust unit to exhaust the process chamber, and an exhaust line connecting the process chamber to the exhaust unit. An opening variable valve is disposed on the exhaust line, and an inactive gas line is connected to the exhaust line on an upstream side of the opening variable valve to introduce an inactive gas. A pressure control mechanism is configured to control a pressure in the process chamber by adjusting at least one of an opening ratio of the opening variable valve and a flow rate of the inactive gas during a process in the process chamber while causing the exhaust unit to exhaust the process chamber and introducing the inactive gas from the inactive gas line into the exhaust line.

11 Claims, 7 Drawing Sheets

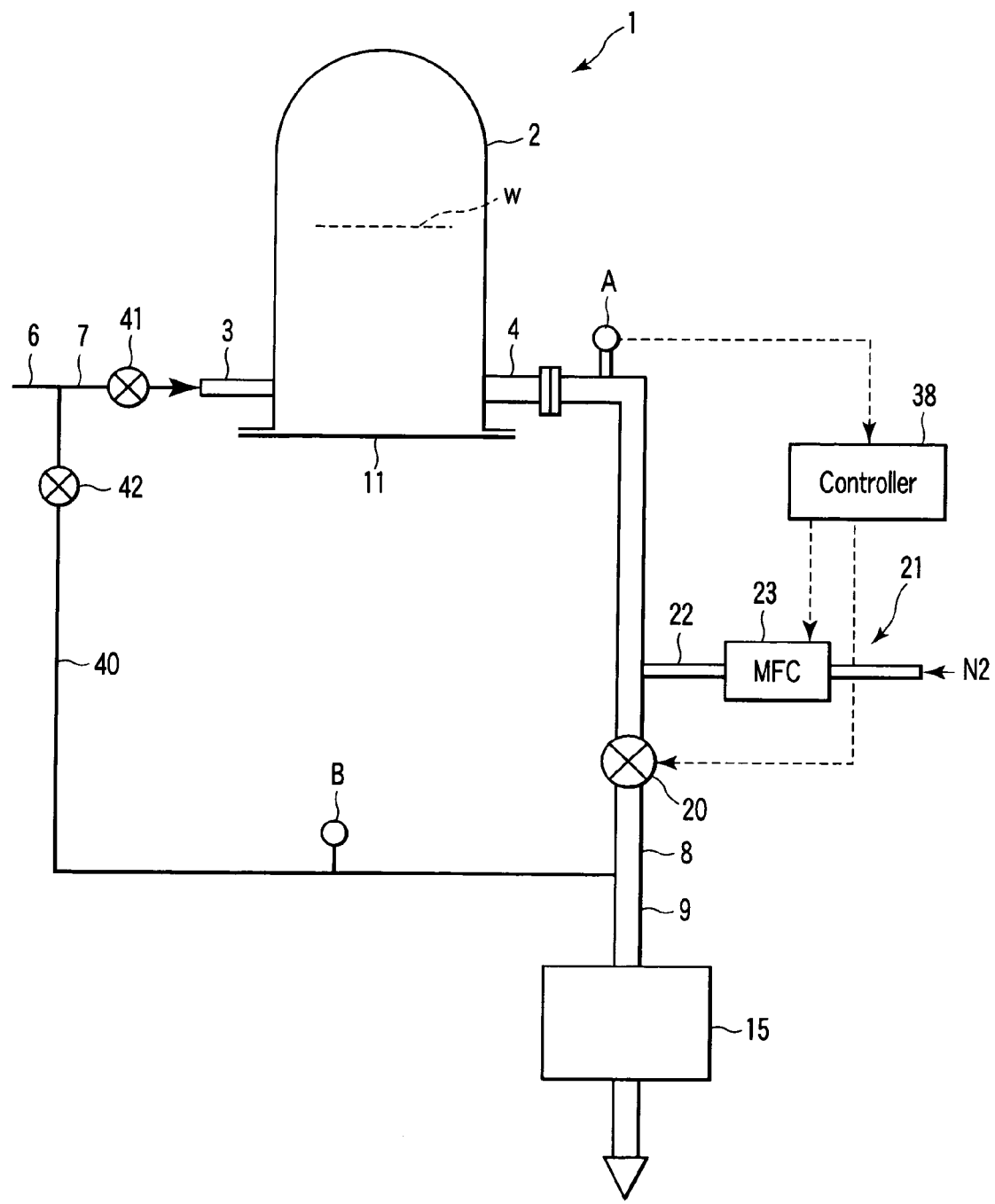
F I G. 1

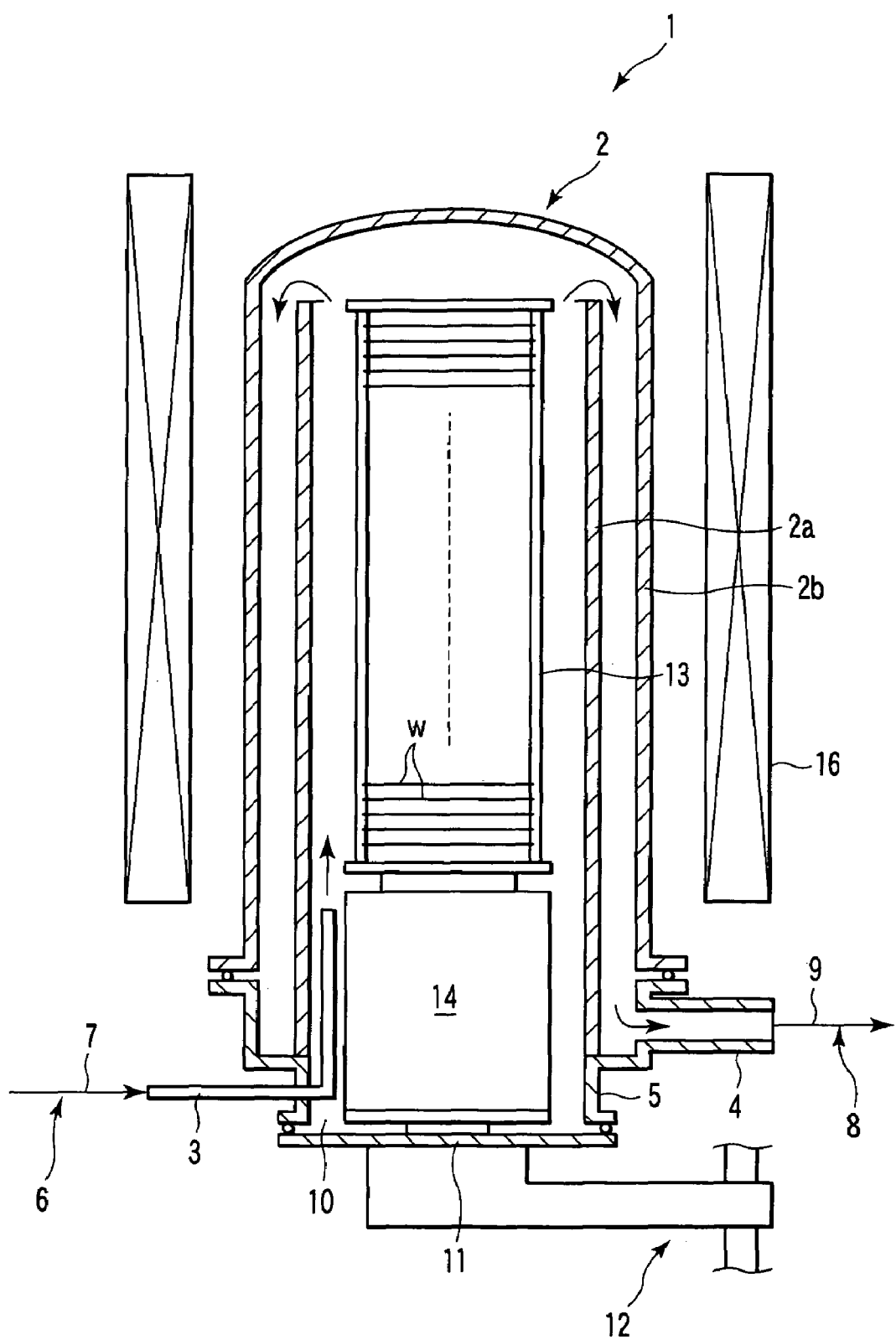
F I G. 2

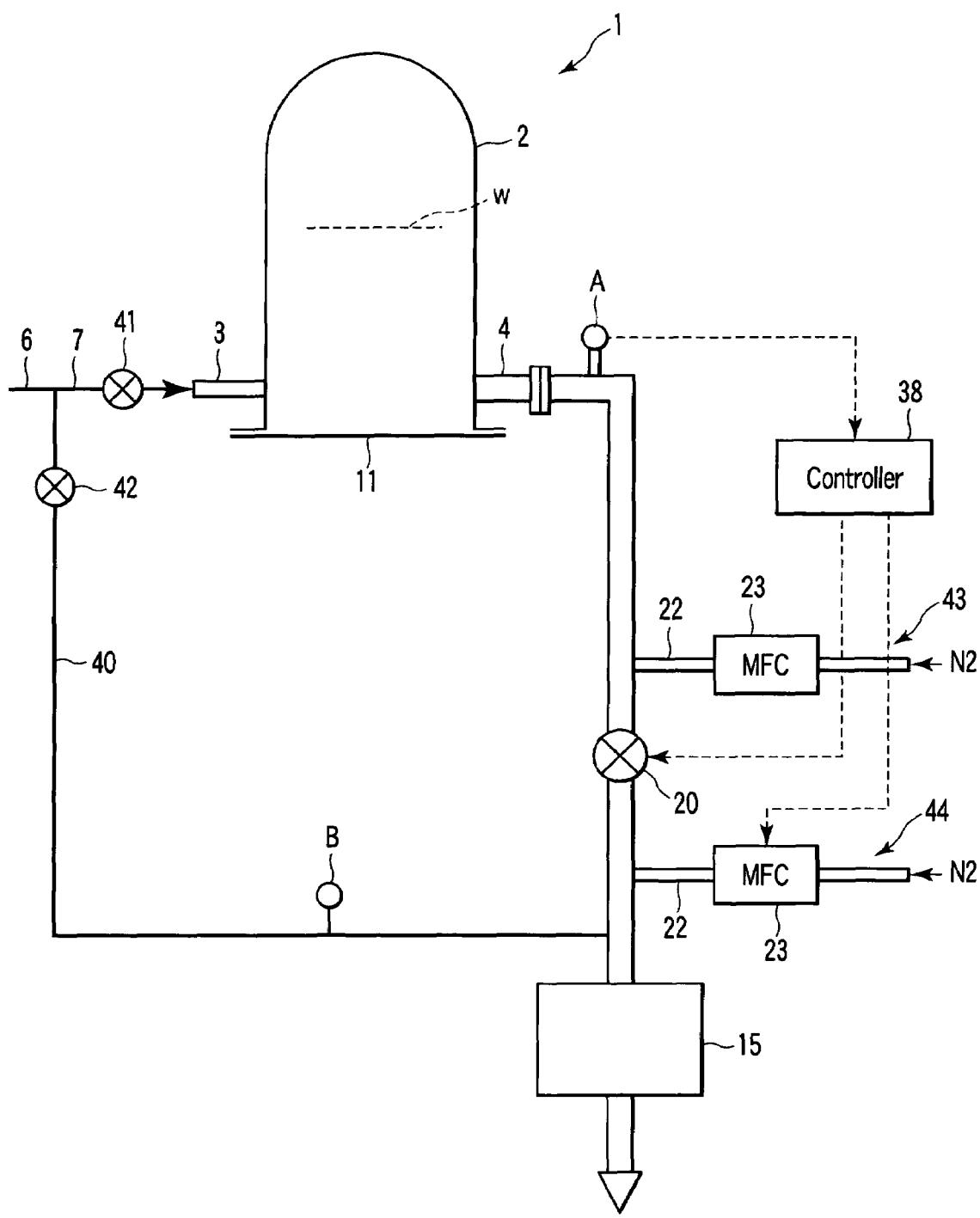
F I G. 5

SEMICONDUCTOR PROCESSING APPARATUS AND METHOD

CROSS-REFERENCE TO RELATED APPLICATIONS

This application is based upon and claims the benefit of priority from prior Japanese Patent Application No. 2004-371680, filed Dec. 22, 2004, the entire contents of which are incorporated herein by reference.

BACKGROUND OF THE INVENTION

1. Field of the Invention

The present invention relates to a semiconductor processing apparatus and method and, more particularly, to a film formation technique. A semiconductor process indicates various processes executed to manufacture, on a target substrate, a structure including a semiconductor device, and interconnections and electrodes connected to the semiconductor device by forming semiconductor layers, insulating layers, and conductive layers in a predetermined pattern on the target substrate such as a semiconductor wafer or a glass substrate for a liquid crystal display (LCD) or flat panel display (FPD).

2. Description of the Related Art

In manufacturing a semiconductor device, a processing apparatus is used to execute various processes such as oxidation, diffusion, CVD, and annealing for a target substrate such as a semiconductor wafer. Jpn. Pat. Appln. KOKAI Publication No. 2003-218098 discloses an apparatus of this type to execute a film formation process. This processing apparatus has a process chamber to accommodate a target substrate such as a semiconductor wafer and process it at a predetermined temperature and pressure in a predetermined gas atmosphere. A process gas supply system and vacuum exhaust system are connected to the process chamber. The vacuum exhaust system has an opening variable valve. A ballast control unit to control the pressure by introducing an inactive gas is arranged on the downstream side of the opening variable valve. In the film formation process, the opening variable valve is fully opened, and the introduction flow rate of the inactive gas is controlled by the ballast control unit, thereby controlling the pressure in the film formation process.

According to this processing apparatus, deposition of a reaction by-product on the opening variable valve can be suppressed to some extent by fully opening the opening variable valve during the film formation process. Since the maintenance period of the apparatus can be prolonged, the apparatus down time in removing the reaction by-product can be reduced to some degree. However, the present inventors have found that deposition of a reaction by-product on the opening variable valve poses a problem even in this processing apparatus depending on the process contents, as will be described later.

BRIEF SUMMARY OF THE INVENTION

It is an object of the present invention to provide a semiconductor processing apparatus and method capable of reliably preventing deposition of a reaction by-product on the opening variable valve of the exhaust system of the semiconductor processing apparatus.

According to a first aspect of the present invention, there is provided a semiconductor processing apparatus comprising:

a process chamber configured to accommodate a target substrate;

a gas supply system configured to supply a process gas into the process chamber;

an exhaust unit configured to exhaust the process chamber;

an exhaust line connecting the process chamber to the exhaust unit;

an opening variable valve disposed on the exhaust line;

an inactive gas line connected to the exhaust line on an upstream side of the opening variable valve to introduce an inactive gas; and a pressure control mechanism configured to control a pressure in the process chamber by adjusting at least one of an opening ratio of the opening variable valve and a flow rate of the inactive gas during a process in the process chamber while causing the exhaust unit to exhaust the process chamber and introducing the inactive gas from the inactive gas line into the exhaust line.

According to a second aspect of the present invention, there is provided a semiconductor processing apparatus comprising:

a process chamber configured to accommodate a target substrate;

a gas supply system configured to supply a process gas into the process chamber;

an exhaust unit configured to exhaust the process chamber;

an exhaust line connecting the process chamber to the exhaust unit;

an opening variable valve disposed on the exhaust line;

a first inactive gas line connected to the exhaust line on an upstream side of the opening variable valve to introduce a first inactive gas;

a second inactive gas line connected to the exhaust line on a downstream side of the opening variable valve to introduce a second inactive gas; and a pressure control mechanism configured to control a pressure in the process chamber by adjusting at least one of an opening ratio of the opening variable valve and a flow rate of the second inactive gas during a process in the process chamber while causing the exhaust unit to exhaust the process chamber and introducing the first inactive gas and the second inactive gas from the first inactive gas line and the second inactive gas line, respectively, into the exhaust line.

According to a third aspect of the present invention, there is provided a processing method of a semiconductor processing apparatus which includes:

a process chamber configured to accommodate a target substrate;

a gas supply system configured to supply a process gas into the process chamber;

an exhaust unit configured to exhaust the process chamber;

an exhaust line connecting the process chamber to the exhaust unit;

an opening variable valve disposed on the exhaust line; and an inactive gas line connected to the exhaust line on an upstream side of the opening variable valve to introduce an inactive gas, the method comprising:

supplying the process gas into the process chamber while exhausting the process chamber, and executing a process for the target substrate in the process chamber; and controlling a pressure in the process chamber by adjusting at least one of an opening ratio of the opening variable valve and a flow rate of the inactive gas during the process while introducing the inactive gas from the inactive gas line into the exhaust line.

According to a fourth aspect of the present invention, there is provided a processing method of a semiconductor processing apparatus which includes:

a process chamber configured to accommodate a target substrate;

a gas supply system configured to supply a process gas into the process chamber;

an exhaust unit configured to exhaust the process chamber;

an exhaust line connecting the process chamber to the exhaust unit;

an opening variable valve disposed on the exhaust line;

a first inactive gas line connected to the exhaust line on an upstream side of the opening variable valve to introduce a first inactive gas; and a second inactive gas line connected to the exhaust line on a downstream side of the opening variable valve to introduce a second inactive gas, the method comprising:

supplying the process gas into the process chamber while exhausting the process chamber, and executing a process for the target substrate in the process chamber; and controlling a pressure in the process chamber by adjusting at least one of an opening ratio of the opening variable valve and a flow rate of the second inactive gas during the process while introducing the first inactive gas and the second inactive gas from the first inactive gas line and the second inactive gas line, respectively, into the exhaust line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a view showing a semiconductor processing apparatus according to a first embodiment of the present invention;

FIG. 2 is a sectional side view showing a heat-processing furnace used in the processing apparatus shown in FIG. 1;

FIG. 5 is a view showing a semiconductor processing apparatus according to a third embodiment of the present invention;

DETAILED DESCRIPTION OF THE INVENTION

Figure 3:
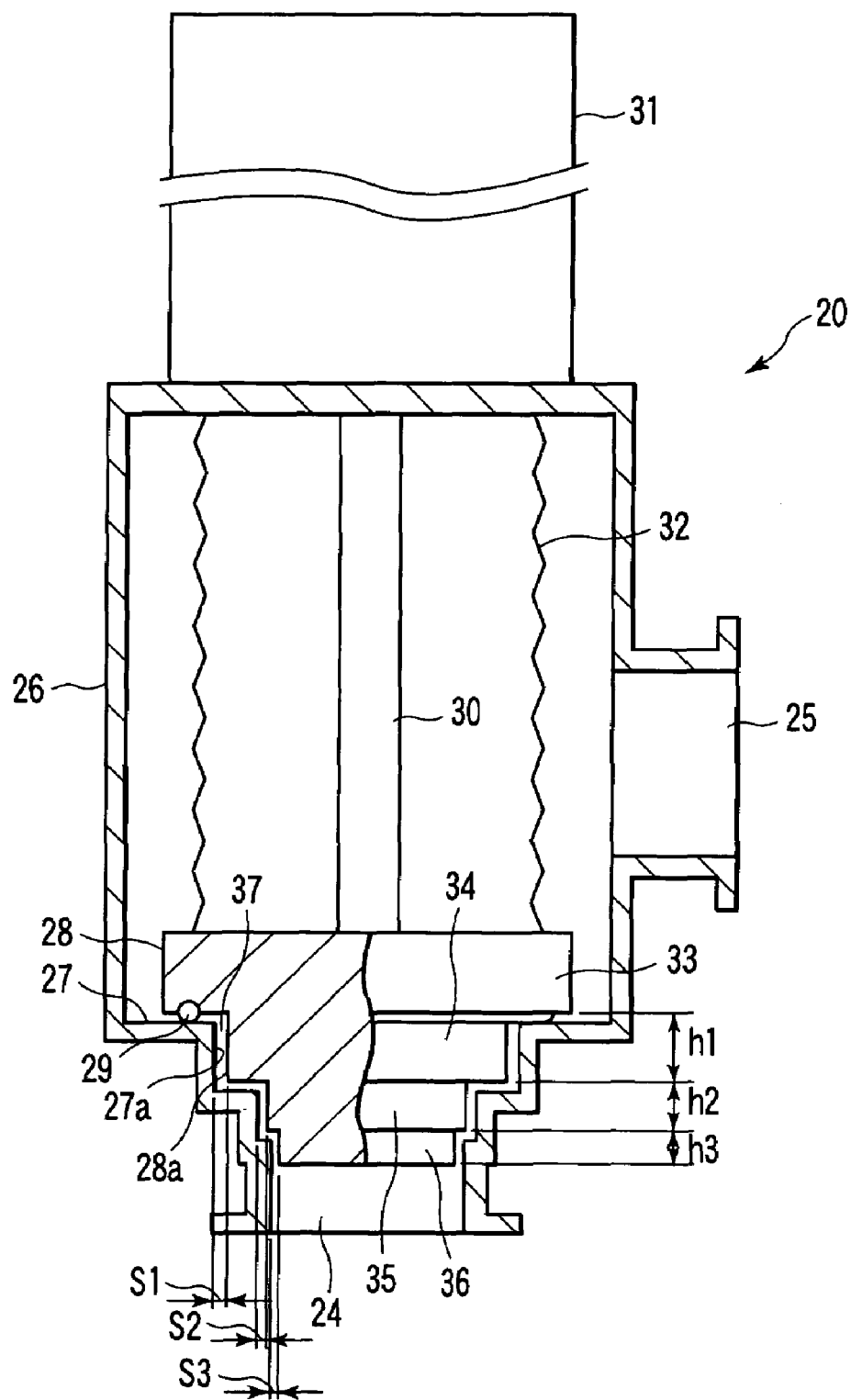
FIG. 3 is a sectional view showing the structure of an opening variable valve used in the processing apparatus shown in FIG. 1.

In the process of developing the present invention, the present inventors have made studies on conventional semiconductor processing apparatuses including the processing apparatus disclosed in Jpn. Pat. Appln. KOKAI Publication No. 2003-218098 and obtained the following findings.

In the processing apparatus disclosed in the above prior art, deposition of a reaction by-product can be suppressed by fully opening the opening variable valve during the film formation process. However, a problem arises in a film formation process such as a tetraethylorthosilicate (TEOS) process. Assume that the film formation process is repeated, and the cumulative thickness of a silicon oxide film reaches about 2.0 µm. In this case, a reaction by-product such as $SiO_2$, i.e., a glass-like hard substance is deposited on the gap between the valve body and valve seat of the opening variable valve. It is then difficult to fully close the opening variable valve, and an internal leakage may occur in this full closing operation. If the internal leakage of the opening variable valve occurs, the pressure in the process chamber can hardly return from the vacuum state to the atmospheric pressure. In addition, $N_2$ purge of the process vent line which directly connects the pumps of the process gas supply system and the vacuum exhaust system is insufficient.

For this reason, the processing apparatus cannot repeat the film formation process until the cumulative thickness reaches 4 µm corresponding to the maintenance period of the TEOS process. That is, maintenance to remove the reaction by-product must be done midway, and the apparatus down time increases inevitably. To more reliably prevent a reaction by-product from being deposited on the opening variable valve of this processing apparatus, a trap must be provided on the upstream side of the opening variable valve.

Embodiments of the present invention based on the above-described findings will be described below with reference to the accompanying drawing. In the following description, the same reference numerals denote constituent elements with almost the same functions and arrangements, and a repetitive description thereof will be done only if necessary.

FIG. 1 is a view showing a semiconductor processing apparatus according to a first embodiment of the present invention. FIG. 2 is a sectional side view showing a heat-processing furnace used in the processing apparatus shown in FIG. 1.

Referring to FIG. 1, a semiconductor processing apparatus 1 is designed as a vertical heat-processing apparatus which forms a thin film on target substrates by CVD. The processing apparatus 1 comprises a reaction tube (process chamber) 2 which is made of, e.g., quartz and accommodates a number of semiconductor wafers W serving as target substrates spaced apart from each other in the vertical direction. The reaction tube 2 has a double-tube structure including an inner tube 2a and outer tube 2b, as shown in FIG. 2. A ring-shaped manifold 5 is hermetically connected to the lower portion of the reaction tube 2. The manifold 5 has a gas introduction pipe (gas introduction port) 3 to introduce a process gas or an inactive gas (e.g., $N_2$) for purge into the reaction tube 2. The reaction tube 2 has an exhaust pipe (exhaust port) 4 to exhaust the reaction tube 2.

A supply line 7 of a process gas supply system 6 is connected to the gas introduction pipe 3. An exhaust line 9 of a vacuum exhaust system 8 having a vacuum pump 15 and opening variable valve 20, which can control the pressure in the reaction tube 2, is connected to the exhaust pipe 4. The manifold 5 is attached to a base plate (not shown). A cylindrical heater 16 capable of heating the interior of the reaction tube 2 to a predetermined temperature of, e.g., about 300° C. to 1,200° C. is disposed around the reaction tube 2.

The manifold 5 at the lower end of the reaction tube 2 forms a load port 10 of the heat-processing furnace. A lid 11 which can be moved up/down by an elevating mechanism 12 to close/open the load port 10 is arranged under the heat-processing furnace. The lid 11 abuts against the open end of the manifold 5 to tightly close the load port 10.

A wafer holder, i.e., boat 13 made of, e.g., quartz is mounted on the lid 11 via a heat insulating cylinder 14 serving as a load port heat insulating means. The boat 13 can horizontally hold a number of, e.g., about 25 to 150 wafers W in multiple stages spaced apart in the vertical direction. The boat 13 is loaded into the reaction tube 2 by causing the elevating mechanism 12 to move the lid 11 upward and unloaded from the reaction tube 2 to the lower loading area by moving the lid 11 downward.

The opening variable valve (also called a combination valve) 20 capable of opening the exhaust line 9 and controlling the pressure in the reaction tube 2 is disposed on the exhaust line 9 of the vacuum exhaust system 8. A ballast control unit 21 to control the pressure by introducing an inactive gas such as nitrogen gas ($N_2$) is connected to the exhaust line 9 on the upstream side of the opening variable valve 20.

FIG. 3 is a sectional view showing the structure of the opening variable valve 20 used in the processing apparatus shown in FIG. 1. As shown in FIG. 3, the opening variable valve 20 comprises a valve chamber 26 of the angle-valve-type with an inlet 24 at the lower end and an outlet 25 on a side portion. A valve seat 27 having a planar shape spread outward radially at a deep portion of the inlet 24 is formed in the valve chamber 26. A valve body 28 capable of contacting or separating from the valve seat 27 is disposed in the valve chamber 26. The valve chamber 26 and valve body 28 are formed from a heat- and corrosion-resistant material such as stainless steel. An O-ring 29 serving as a sealing means and made of, e.g., fluorocarbon rubber is arranged at a portion of the valve body 28 which is attached to the valve seat 27.

The upper central portion of the valve body 28 is connected to a valve body driving unit 31 at the top of the valve chamber 26 through a valve stem 30 which extends vertically through the upper end of the valve chamber 26. The valve body driving unit 31 includes, e.g., a pulse motor and screw mechanism and functions as a driving means for making the valve body 28 contact or separate from the valve seat 27. An extendable bellows 32 made of stainless steel is connected by welding between the upper end of the valve body 28 and the upper end of the valve chamber 26 as a means for covering the periphery of the valve stem 30 and sealing its through portion while allowing movement of the valve body 28.

The valve body 28 is formed into a circular shape whose diameter decreases stepwise downward. In correspondence with the upper end shape of the valve body 28, the valve seat 27 is also formed on the side of the inlet 24 to decrease the diameter stepwise. The lower surface of an upper-end maximum-diameter portion 33 of the valve body 28 opposes the upper surface of the valve seat 27. The O-ring 29 is arranged at this portion. The small-diameter portion of the valve body 28 has a plurality of stages, e.g., three stages including an upper stage 34, middle stage 35, and lower stage 36 under the upper-end maximum-diameter portion 33.

Side wall portions 28a and 27a which oppose each other in a direction perpendicular to the moving direction of the valve body 28 are formed on the small-diameter portions of the valve body 28 and valve seat 27, respectively. The diameters of the pair of side wall portions 28a and 27a increase stepwise in the open moving direction (upward direction) of the valve body 28. A gap 37 for fine adjustment is formed between the side wall portions 28a and 27a. As for the size of the gap 37 in the moving direction of the valve body 28 at the stages 34, 35, and 36, the gap 37 is set to be larger at the upper stage 34 on the large-diameter side than at the lower stage 36 on the small-diameter side. That is, when the heights of the stages 34, 35, and 36 are defined as h1, h2, and h3, h1>h2>h3 holds. As for the width (horizontal interval) of the gap 37 at the stages 34, 35, and 36, the gap 37 is set to be wider at the upper stage 34 than at the lower stage 36. That is, when the widths of the gap 37 at the stages 34, 35, and 36 are defined as s1, s2, and s3, s1>s2>s3 holds.

The conductance of vacuum pressure in the gap 37 is proportional to the cross-sectional area of the gap 37 and inversely proportional to the tallness of the gap 37. When the valve body 28 is gradually opened from the closed position, the pressure is first dominated by the gap 37 of the lower stage 36 with the minimum cross-sectional area, then by the gap 37 of the middle stage 35, and finally by the gap 37 of the upper stage 34. When the gap 37 with the above-described format is formed, low vacuum (weak reduced pressure) control can be executed in a relatively wide range of 100 Torr to atmospheric pressure. In this embodiment, to widen the low vacuum control range, the width of the gap 37 is set to s1>s2>s3. However, since the cross-sectional area of the gap 37 increases in proportion to the diameter, the gap 37 may have a predetermined width.

Medium vacuum (medium reduced pressure) to high vacuum (strong reduced pressure) control is done in a moving range from a position of the valve body 28 where the cross-sectional area between the valve body 28 and the valve seat 27 exceeds the cross-sectional area of the gap 37 of the upper stage 34 to the maximum open position (full open position). At the maximum opening, the pressure can be reduced to, e.g., $1 \times 10^{-3}$ Torr although it depends on the capability of the vacuum pump 15.

The ballast control unit 21 includes an inactive gas supply line 22 connected to the side portion of the exhaust line 9 of the vacuum exhaust system 8 and a mass flow controller 23 provided on the inactive gas supply line 22. The mass flow controller 23 comprises a flow rate sensor and flow rate control valve (neither are shown). The flow rate control valve is fully closed when no ballast control is executed.

To control the pressure in the reaction tube 2 and the pressure of the vacuum exhaust system 8, the exhaust line 9 of the vacuum exhaust system 8 comprises a pressure sensor A to detect the pressure in the furnace and the exhaust pressure in the exhaust line 9, and a controller 38 connected to the pressure sensor A. The controller 38 executes sequential control of the opening variable valve 20 and the mass flow controller 23 of the ballast control unit 21 in accordance with the process while comparing a set pressure with a pressure detected by the pressure sensor A on the basis of a preset process program.

The controller 38 can control the pressure in the reaction tube 2 selectively in different forms. Pressure control in initial vacuum exhaust, evacuation, and low vacuum process in the reaction tube 2 is executed by adjusting the opening ratio of the opening variable valve 20. On the other hand, in a film formation process such as a TEOS process wherein a reaction by-product is deposited on the pressure varying portion of the exhaust system at room temperature, pressure control is executed by the ballast control unit 21 while fully opening the opening variable valve 20. During the film formation process, the controller 38 sets the opening variable valve 20 in the full open state and causes the ballast control unit 21 to adjust the introduction flow rate of the inactive gas, thereby controlling the pressure in the reaction tube 2. The pressure sensor A can be disposed to directly detect the pressure in the reaction tube 2.

A process vent line (to be referred to as a vent line hereinafter) 40 is connected to directly connect the supply line 7 of the process gas supply system 6 to a portion of the pipe 4 of the vacuum exhaust system 8 on the downstream side of the opening variable valve 20. With the vent line 40, $N_2$ purge of the supply line 7 can be done to directly exhaust the process gas in the supply line 7 of the process gas supply system 6 without intervening the reaction tube 2. The supply line 7 of the process gas supply system 6 and the vent line 40 have valves 41 and 42 to switch the line, respectively.

A pressure sensor B to detect the pressure of the vent line 40 is arranged on the vent line 40. When the opening variable valve 20 and valve 42 are fully opened, and the pressure of the vent line 40 is measured by the pressure sensor B, it can easily be detected whether an internal leakage has occurred in the opening variable valve 20. If no internal leakage has occurred in the opening variable valve 20, the measurement value of the pressure sensor B is small. If an internal leakage has occurred, the measurement value is large.

The function and processing method of the processing apparatus with the above-described arrangement will be described next.

In the first embodiment shown in FIG. 1, first, an inactive gas such as $N_2$ is introduced from the gas introduction pipe 3 into the reaction tube 2. Simultaneously, the reaction tube 2 is exhausted from the exhaust pipe 4 by the vacuum exhaust system 8, thereby purging the interior of the reaction tube 2 with the nitrogen gas. The lid 11 is opened, and the heat-processing boat 13 with the wafers W is loaded into the reaction tube 2 together with the heat insulating cylinder 14.

The valve of the process gas supply system 6 of the gas introduction pipe 3 is closed. In this state, the reaction tube 2 is vacuum-exhausted through the vacuum exhaust system 8 to execute evacuation. At this time, to prevent lifting of particles, the valve body 28 of the opening variable valve 20 is slightly opened from the closed position to execute slow vacuum through the gap 37 until the pressure becomes, e.g., 10 Torr. Next, the valve body 28 is fully opened, and the reaction tube is vacuum-exhausted to the base pressure of, e.g., $1 \times 10^{-3}$ Torr.

When the vacuum-exhaust is ended, a process gas is introduced from the process gas supply system 6 into the reaction tube 2, and a predetermined process, e.g., a film formation process for a wafer is started. If this film formation process is a TEOS process, a reaction by-product such as silicon dioxide ($SiO_2$), i.e., a hard substance can be deposited on the pressure varying portion of the exhaust system at room temperature. To prevent this, the valve body 28 of the opening variable valve 20 is set in the full open state (opening ratio: 100%), and $N_2$ gas is introduced into the exhaust line 9 of the vacuum exhaust system 8 by the ballast control unit 21 on the upstream side of the opening variable valve. Pressure control is done by controlling the $N_s$ gas introduction amount such that the pressure in the reaction tube 2 becomes a predetermined process pressure, e.g., about 0 to 1 Torr.

The TEOS process mainly forms an interlayer dielectric film on a wafer by using TEOS ($Si(C_2H_5O)_4$) as the material of the process gas. Examples of process conditions are as follows. The process temperature is 680° C., the process pressure is 53.2 Pa (0.4 Torr), and the process gas is TEOS at a flow rate of 85 sccm. TEOS is a liquid at room temperature and can be gasified at 166° C. or more.

When the film formation process is ended, vacuum-exhaust and purging with nitrogen gas are executed in the reaction tube 2. The next process can be executed continuously. To end the process, after vacuum-exhaust and purging with nitrogen gas are executed, the pressure in the reaction tube is returned to the atmospheric pressure. Then, the lid 11 is opened to the lower side, and the heat-processing boat 13 is unloaded from the reaction tube 2.

As described above, according to the processing apparatus and method of the first embodiment, in the film formation process, an inactive gas is introduced from the upstream side of the opening variable valve 20 of the vacuum exhaust system 8. For this reason, the opening ratio of the opening variable valve 20 can be increased, the flow velocity of the gas passing through the opening variable valve 20 can be increased, and the process gas passing through the opening variable valve 20 can be diluted. With this arrangement, since deposition of a reaction by-product on the opening variable valve 20 is suppressed, the internal leakage in the opening variable valve 20 can be suppressed. Since the maintenance period of the opening variable valve 20 can be prolonged, the down time to remove the reaction by-product can be shortened. Since the internal leakage (i.e., deposition of a reaction by-product) in the opening variable valve 20 can be suppressed or prevented, no trap need be arranged in the vacuum exhaust system 8. Hence, the structure can be simplified, and the cost can be reduced.

An experiment which was conducted to confirm the effect of the first embodiment will be described next. In this experiment, whether an internal leakage had occurred in the opening variable valve 20 was determined on the basis of the pressure measured by the pressure sensor B. As described above, whether an internal leakage has occurred in the opening variable valve 20 can easily be detected or confirmed by measuring the pressure of the vent line 40 by the pressure sensor B while setting the valve 42 of the vent line 40 and the opening variable valve 20 in the full open state.

Figure 6:
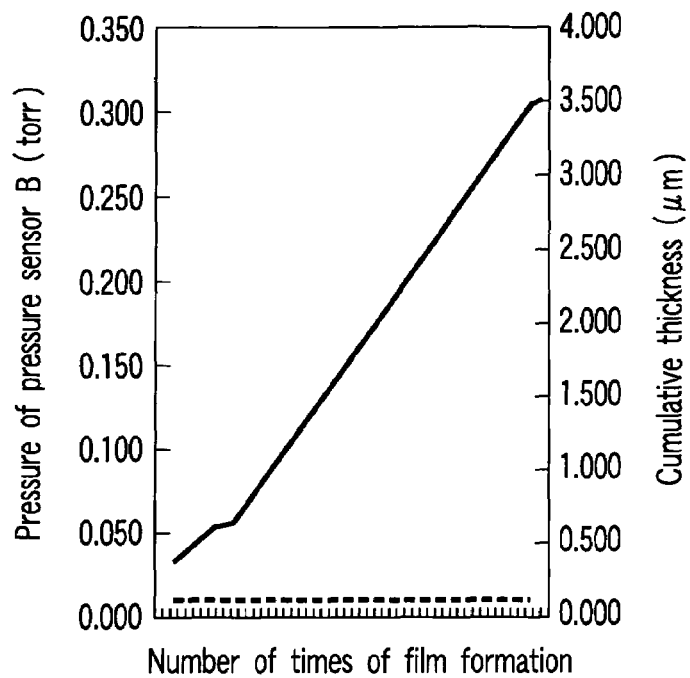
FIG. 6 is a graph showing the relationship between the number of times of film formation, the cumulative thickness, and the pressure of a pressure sensor B in the processing apparatus shown in FIG. 1.
Figure 8:
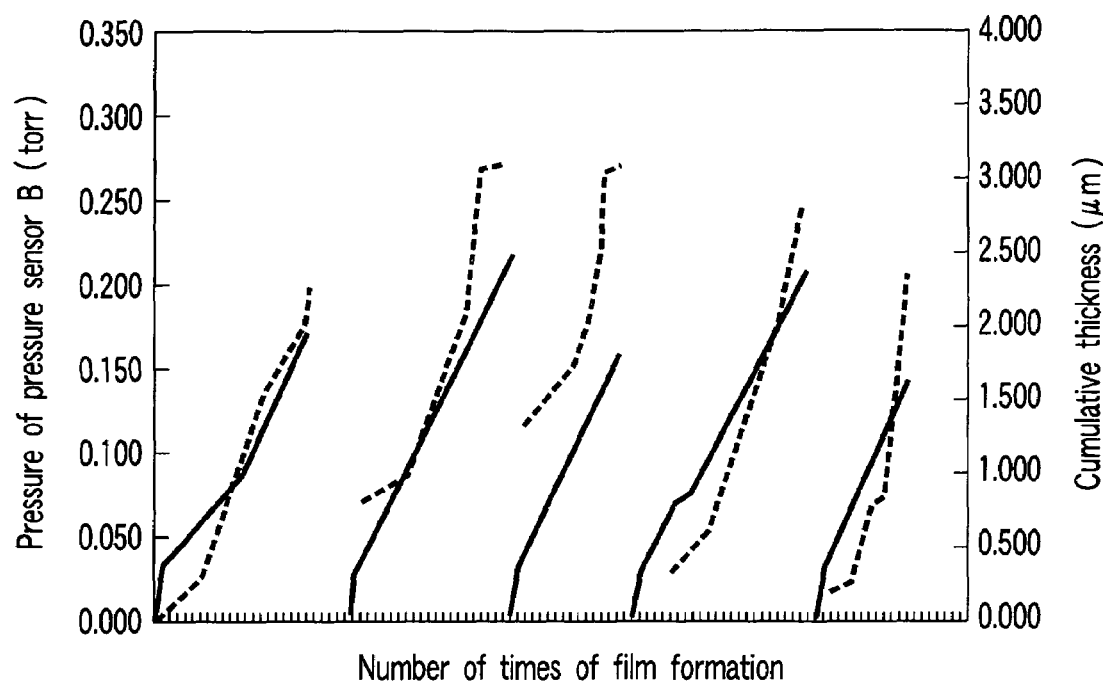
FIG. 8 is a graph showing the relationship between the number of times of film formation, the cumulative thickness, and the pressure of a pressure sensor B in a conventional processing apparatus.

FIG. 6 is a graph showing the relationship between the number of times of film formation, the cumulative thickness, and the pressure of the pressure sensor B in the processing apparatus shown in FIG. 1. FIG. 8 is a graph showing the relationship between the number of times of film formation, the cumulative thickness, and the pressure of the pressure sensor B in a conventional processing apparatus. Referring to FIGS. 6 and 8, the abscissa represents the number of times of film formation, a solid line indicates a change in cumulative thickness, and a dotted line indicates a change in pressure of the pressure sensor B. To obtain the data shown in FIG. 8, the conventional processing apparatus was designed to introduce an inactive gas to only the downstream side of the exhaust line 9 of the vacuum exhaust system 8, as disclosed in the above-described Jpn. Pat. Appln. KOKAI Publication No. 2003-218098.

As shown in FIG. 8, in the data of the conventional processing apparatus, the pressure (detected pressure) of the pressure sensor B increases along with the increase in cumulative thickness. For example, when the cumulative thickness is 2.0 μm, the pressure of the pressure sensor B exceeds 0.15 Torr, indicating that the internal leakage in the opening variable valve 20 is progressing. For this reason, in the conventional processing apparatus, maintenance must frequently be executed to remove the reaction by-product deposited on the opening variable valve 20. Alternatively, a trap to capture the reaction by-product must be provided. Even in this experiment, actually, maintenance to remove the reaction by-product on the opening variable valve 20 was executed frequently when the cumulative thickness was 2 μm, as shown in FIG. 8.

As shown in FIG. 6, in the data of the processing apparatus shown in FIG. 1, the pressure of the pressure sensor B does not increase even when the film formation process is repeated, and the cumulative thickness increases. For example, when the cumulative thickness is 3.5 μm, the pressure of the pressure sensor B is 0.01 Torr, indicating that the internal leakage in the opening variable valve is suppressed or prevented.

According to the opening variable valve 20, a state wherein the valve body 28 contacts the valve seat 27 (closed), a state wherein the valve body 28 is separated from the valve seat 27 (open), a state wherein the valve body 28 moves in the stroke of the gap 37 (slow vacuum and low vacuum control), and a state wherein the valve body 28 moves outside the stroke of the gap 37 (medium vacuum or high vacuum) are obtained. For this reason, not only opening/closing of the vacuum exhaust system 8 but also control in a wide pressure range including high vacuum control, slow vacuum, and low vacuum control can be done by the single valve.

In initial vacuum exhaust, the opening variable valve 20 can execute continuous variable control at an exhaust rate of 0.1 to 20 Torr/sec. For this reason, when optimization is done, vacuum exhaust in a shortest time can be implemented while preventing lifting of particles. Hence, the turn-around time (TAT) can be shortened. In evacuation (purge) in the reaction tube 2, unlike conventional $N_2$ purge by fully opening the main valve, the reaction tube 2 can be purged by repeatedly increasing/decreasing the pressure (e.g., $10^2$ Torr to $10^{-3}$ Torr) by pressure control of the opening variable valve 20 in the wide range. For this reason, vacuum-exhaust can be done in a short time, and the TAT can further be shortened.

A low vacuum process can be executed in which the pressure in the reaction tube 2 is reduced to low vacuum (weak reduced pressure) of, e.g., several hundred Torr by the opening variable valve 20, and in this state, the reaction tube 2 is cleaned by introducing a cleaning gas from the process gas supply system 6 into the reaction tube 2. A plurality of kinds of processes using different gas species or process pressures can be executed by combining the opening variable valve 20 and ballast control unit 21. The plurality of kinds of processes may be executed continuously.

Figure 4:
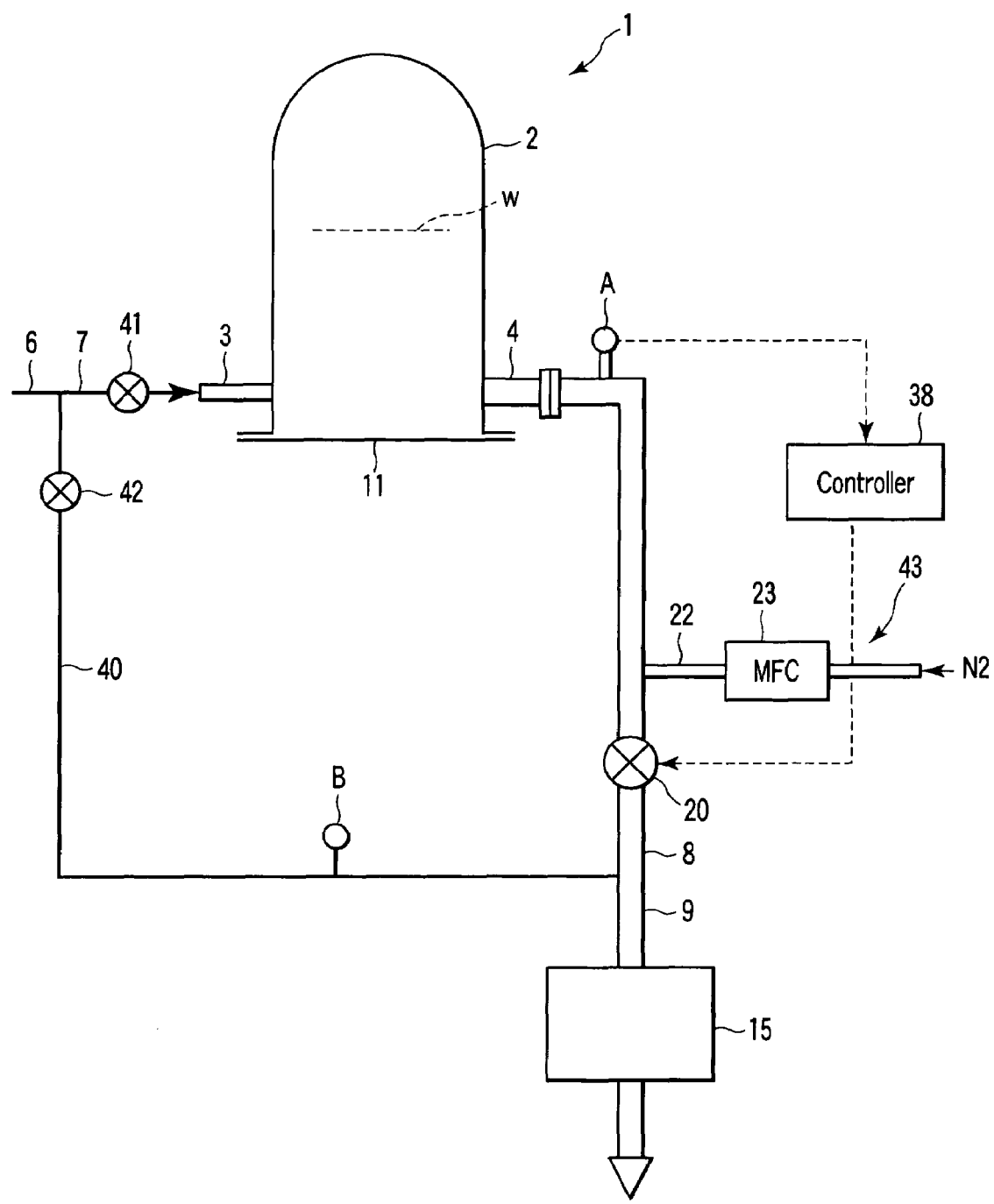
FIG. 4 is a view showing a semiconductor processing apparatus according to a second embodiment of the present invention.

FIG. 4 is a view showing a semiconductor processing apparatus according to a second embodiment of the present invention. As shown in FIG. 4, in a processing apparatus 1 of this embodiment, an opening variable valve 20 is arranged on an exhaust line 9 of a vacuum exhaust system 8. In addition, an inactive gas introduction unit 43 to introduce an inactive gas such as nitrogen gas ($N_2$) at a predetermined (constant, i.e., fixed) flow rate is connected to the upstream side of the opening variable valve 20. A controller 38 controls the pressure in a reaction tube 2 by controlling the opening ratio of the opening variable valve 20 while introducing an inactive gas from the inactive gas introduction unit 43 at a predetermined flow rate.

The inactive gas introduction unit 43 includes an inactive gas supply line 22 connected to the side portion of the exhaust line 9 of the vacuum exhaust system 8 and a mass flow controller (MFC) 23 provided on the inactive gas supply line 22. However, in a film formation process, the flow rate of the inactive gas is not variably controlled but fixed. For example, when the film formation process is executed at 0.4 Torr, $N_2$ gas is introduced from the inactive gas introduction unit 43 at about 4 to 5 lit/min. The pressure in the furnace (reaction tube 2) is controlled by adjusting the opening ratio of the opening variable valve 20. In this case, the opening ratio of the opening variable valve 20 is preferably relatively high, e.g., about 80%. The mass flow controller 23 of the inactive gas introduction unit 43 comprises a flow rate sensor and flow rate control valve (neither are shown). The flow rate control valve is fully closed when no inactive gas is introduced.

Figure 7:
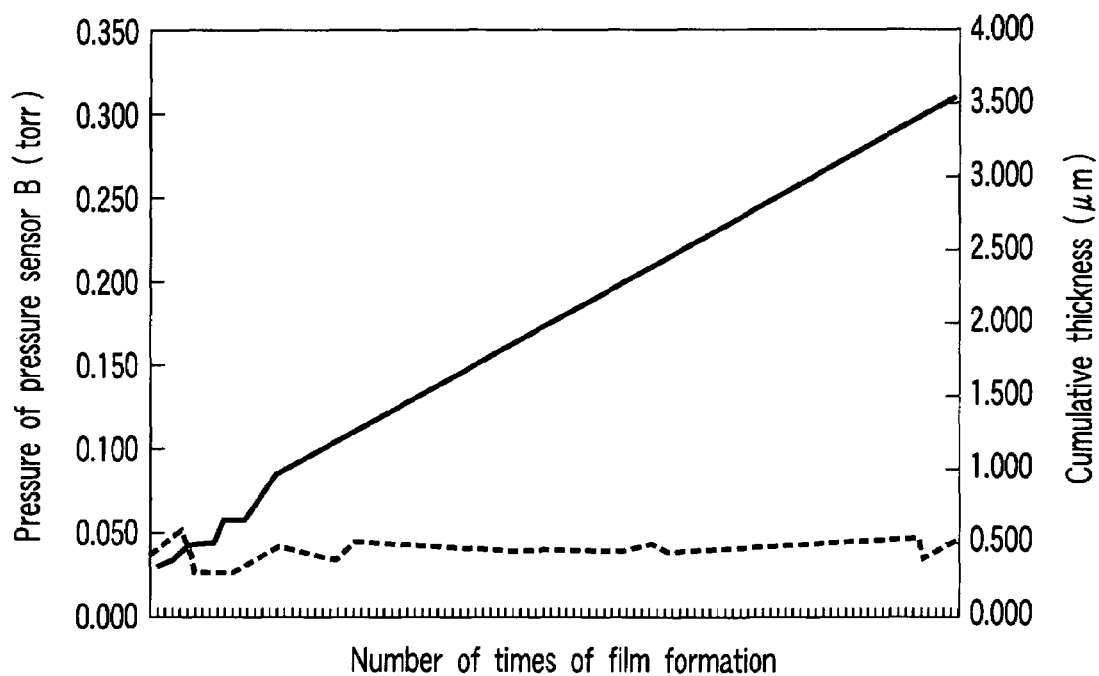
FIG. 7 is a graph showing the relationship between the number of times of film formation, the cumulative thickness, and the pressure of a pressure sensor B in the processing apparatus shown in FIG. 4.

According to the processing apparatus and method of the second embodiment, the same effects as in the processing apparatus and method of the first embodiment can be obtained. FIG. 7 is a graph showing the relationship between the number of times of film formation, the cumulative thickness, and the pressure of the pressure sensor B in the processing apparatus shown in FIG. 4. As shown in FIG. 7, in the data of the processing apparatus shown in FIG. 4, the pressure of the pressure sensor B does not increase even when the film formation process is repeated, and the cumulative thickness increases. For example, when the cumulative thickness is 3.6 μm, the pressure of the pressure sensor is 0.04 Torr, indicating that the internal leakage in the opening variable valve is suppressed or prevented.

In the processing apparatus according to the first embodiment, since the opening variable valve is fully open during the film formation process, the pressure control range is limited to 1 Torr at maximum. In the processing apparatus according to the second embodiment, however, since the opening ratio of the opening variable valve during the film formation process can be reduced to about 80%, the pressure control range can be widened to about 3 Torr to atmospheric pressure at maximum.

FIG. 5 is a view showing a semiconductor processing apparatus according to a third embodiment of the present invention. As shown in FIG. 5, in a processing apparatus 1 of this embodiment, an opening variable valve 20 is arranged on an exhaust line 9 of a vacuum exhaust system 8. In addition, an inactive gas introduction unit 43 to introduce a first inactive gas at a predetermined flow rate is connected to the upstream side of the opening variable valve 20. A ballast control unit 44 to control pressure by introducing a second inactive gas is connected to the downstream side of the opening variable valve 20. A controller 38 controls the pressure in a reaction tube 2 by causing the ballast control unit 44 to adjust the introduction flow rate of the second inactive gas while setting the opening variable valve 20 to a predetermined high opening ratio and introducing the first inactive gas from the inactive gas introduction unit 43 at a predetermined flow rate. The first and second inactive gases can be the same gas, e.g., nitrogen gas ($N_2$).

According to the processing apparatus and method of the third embodiment, the same effects as in the processing apparatus and method of the first embodiment can be obtained. That is, since deposition of a reaction by-product on the opening variable valve 20 is suppressed, the internal leakage in the opening variable valve 20 can be suppressed. In the third embodiment, the opening ratio of the opening variable valve 20 during the film formation process is preferably relatively high, e.g., about 50% to 90%. When the opening variable valve is fully open (100%), the pressure control range is limited to 1 Torr at maximum. The opening ratio of the opening variable valve 20 is proportional to the distance from a valve seat 27 to a valve body 28. For example, when the open stroke of the valve body 28 is 3 cm, the opening ratio is 100% when the distance from the valve seat 27 to the valve body 28 is 3 cm. When the distance is 1.5 cm, the opening ratio is 50%.

In the first to third embodiments, the processing apparatus is a vertical heat-processing apparatus. This may be a horizontal heat-processing apparatus. The processing apparatus is not limited to a batch type for processing a number of target substrates at once but may be a single substrate type for processing target substrates one by one. The processing apparatus may be an apparatus, e.g., an etching apparatus which executes a process other than the film formation process, wherein a reaction by-product is generated. As a target substrate, not only a semiconductor wafer but also an LCD substrate may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A processing method using a semiconductor processing apparatus, the method comprising:
preparing a processing apparatus to include a process chamber configured to accommodate a target substrate, a gas supply system configured to supply a process gas into the process chamber, an exhaust unit configured to exhaust the process chamber, an exhaust line connecting the process chamber to the exhaust unit, an opening variable valve disposed on the exhaust line, and an inactive gas line connected to the exhaust line at a position between the process chamber and the opening variable valve to introduce an inactive gas;
supplying the process gas from the gas supply system into the process chamber while exhausting gas, using the exhaust unit, from inside the process chamber through the exhaust line and the opening variable valve, thereby executing a process for the target substrate in the process chamber;
introducing the inactive gas from the inactive gas line into the exhaust line during the executed process while exhausting gas using the exhaust unit, thereby causing the inactive gas to pass through the opening variable valve along with the process gas being exhausted; and
controlling a pressure in the process chamber to be a process pressure for the process by adjusting a flow rate of the inactive gas introduced from the inactive gas line into the exhaust line while setting the opening variable valve to a predetermined opening ratio.

2. The method according to claim 1, wherein the processing apparatus further comprises a flow controller disposed on the inactive gas line and configured to adjust a flow rate of the inactive gas, and the method comprises controlling the pressure in the process chamber by adjusting an operation of the flow controller during the process.

3. The method according to claim 1, wherein the predetermined opening ratio is a fully open state.

4. The method according to claim 1, wherein the method further comprises controlling the pressure in the process chamber by adjusting an opening ratio of the opening variable valve while introducing the inactive gas into the exhaust line at a predetermined flow rate during the process.

5. The method according to claim 1, wherein the process gas is a gas for forming a film on the target substrate by CVD.

6. A processing method using a semiconductor processing apparatus, the method comprising:
preparing a processing apparatus to include a process chamber configured to accommodate a target substrate, a gas supply system configured to supply a process gas into the process chamber, an exhaust unit configured to exhaust the process chamber, an exhaust line connecting the process chamber to the exhaust unit, an opening variable valve disposed on the exhaust line, a first inactive gas line connected to the exhaust line at a position between the process chamber and the opening variable valve to introduce a first inactive gas, and a second inactive gas line connected to the exhaust line on a downstream side of the opening variable valve to introduce a second inactive gas;
supplying the process gas from the gas supply system into the process chamber while exhausting gas, using the exhaust unit, from inside the process chamber through the exhaust line and the opening variable valve, thereby executing a process for the target substrate in the process chamber;
introducing the first inactive gas and the second inactive gas from the first inactive gas line and the second inactive gas line, respectively, during the executed process while exhausting gas by the exhaust unit, thereby causing the first inactive gas to pass through the opening variable valve along with the process gas being exhausted; and
controlling a pressure in the process chamber to be a process pressure for the process by adjusting a flow rate of the second inactive gas introduced from the second inactive gas line into the exhaust line while setting the opening variable valve at a predetermined opening ratio.

7. The method according to claim 6, wherein the processing apparatus further comprises a flow controller disposed on the second inactive gas line and configured to adjust a flow rate of the second inactive gas, and the method comprises controlling the pressure in the process chamber by adjusting an operation of the flow controller during the process.

8. The method according to claim 6, wherein the process gas is a gas for forming a film on the target substrate by CVD.

9. The method according to claim 5, wherein the process gas comprises TEOS ($Si(C_2H_5O)_4$) gas.

10. The method according to claim 6, wherein the method further comprises controlling the pressure in the process chamber by adjusting an opening ratio of the opening variable valve while introducing the first and second inactive gases into the exhaust line at predetermined flow rates during the process.

11. The method according to claim 8, wherein the process gas comprises TEOS ($Si(C_2H_5O)_4$) gas.

* * * * *